United States Patent [19]

Smith et al.

[11] Patent Number: 5,553,700
[45] Date of Patent: Sep. 10, 1996

[54] TREATMENT METHOD AND APPARATUS FOR PRINTED CIRCUIT BOARDS AND THE LIKE

[75] Inventors: Stanley B. Smith, Boalsburg; G. Allen Blakeslee, Bellefonte, both of Pa.

[73] Assignee: Atotech USA, Inc., State College, Pa.

[21] Appl. No.: 419,717

[22] Filed: Apr. 10, 1995

[51] Int. Cl.$^6$ .......................... B65G 13/02; C23C 14/00; C25B 9/00; C25B 11/00

[52] U.S. Cl. .................... 198/780; 134/64 R; 134/902; 198/791; 204/298.23; 204/298.35

[58] Field of Search ............... 134/64 R, 122 R, 134/902; 193/37; 198/780, 791, 860.1; 204/298.23, 298.35

[56] References Cited

U.S. PATENT DOCUMENTS

| | | | |
|---|---|---|---|
| 1,447,648 | 3/1923 | Deulin | 198/780 |
| 1,975,708 | 10/1934 | Bleibler | 134/64 R |
| 2,474,717 | 6/1949 | Belcher | 134/64 R |
| 2,592,581 | 4/1952 | Lorig | 193/37 |
| 3,348,657 | 10/1967 | Fredrikson | 134/122 R |
| 3,935,041 | 1/1976 | Goffredo et al. | 156/18 |
| 3,945,413 | 3/1976 | Eriksson | 198/780 |
| 3,952,482 | 4/1976 | Quick | 198/780 |
| 3,964,588 | 6/1976 | Kornylak | 193/37 |
| 4,015,706 | 4/1977 | Goffredo et al. | 198/780 |
| 4,017,982 | 4/1977 | Goffredo | 34/31 |
| 4,046,248 | 9/1977 | Goffredo et al. | 198/583 |
| 4,781,205 | 11/1988 | Shakley | 134/131 |
| 4,911,284 | 3/1990 | Weihe et al. | 198/780 |
| 4,999,079 | 3/1991 | Ash | 156/345 |
| 5,176,158 | 1/1993 | Ketelhohn et al. | 134/32 |

FOREIGN PATENT DOCUMENTS

| | | | |
|---|---|---|---|
| 1296065 | 5/1962 | France | 193/37 |
| 2642627 | 4/1977 | Germany | 198/780 |
| 8200216 | 8/1982 | Netherlands | 193/37 |

*Primary Examiner*—Janet C. Baxter
*Assistant Examiner*—J. Pasterczyk
*Attorney, Agent, or Firm*—Paul & Paul

[57] ABSTRACT

A method and apparatus for transporting thin materials, such as printed circuit boards, through an apparatus for treatment of said boards with an etchant, rinse or other chemical process step, including a transport conveyor having a plurality of rotation members with a specially configured rim for contacting the thin materials and moving them through the apparatus with a longer contact path in each rotation of a rotation member than the circumference of the rotation member.

5 Claims, 4 Drawing Sheets

TREATMENT METHOD AND APPARATUS FOR PRINTED CIRCUIT BOARDS AND THE LIKE

BACKGROUND OF THE INVENTION

1. Field of Invention

The present invention relates to a method and apparatus for chemically treating thin materials.

2. Description of the Prior Art

In the field of wet processing, particularly that of treatment of printed circuit boards and industrial parts, the boards are often treated by wave soldering, etching, cleaning or the like, followed by various other treatments, generally including as a minimum, rinsing and drying. Similarly, in other types of treatments, such as electroplating or the like, the articles or items being plated are likewise followed by subsequent treatment steps, such as rinsing, drying and the like.

In the electronics industry, the art has developed progressively thinner printed circuit boards to the extent that the rigid or semi-ridged printed boards have become increasingly thinner and approach or become more of a flexible film. The processing of such "boards", which can more precisely resemble films, presents new concerns in the handling of these articles, as the thin materials have a tendency to buckle and cause jamming of the treatment or processing apparatus. This is especially the case where the circuit board material comprises a thin film and where a liquid treatment tends to accumulate on the board and weigh it down as it is being moved along the apparatus. In some cases additional supports have been provided on an apparatus to retain the film in place as it travels through a processing area or treatment center. One attempt to deal with this problem is shown in U.S. Pat. No. 4,781,205, the complete disclosure of which is herein incorporated by reference, wherein an arrangement of several fixedly disposed bands at staggered positions along the transport means are utilized. In addition, U.S. Pat. No. 5,176,158, the complete disclosure of which is herein incorporated by reference, supports thin circuit boards with guide wires which are moved back and forth as the circuit board or article is being transported.

However, in some instances, the presence of additional elements masks areas of the board to be treated from the treatment process, and such additional elements may prevent the removal of residues of the treatment process in a cleaning operation, such as, for example, rinsing with water which may be done to remove excess treatment chemicals.

Other transport methods known in the prior art include contacting boards with a series of thin cylindrical wheels. In such prior art applications, each wheel often includes a circumferential surface which continually contacts a board over a single linear longitudinal path across a board's surface. This permits the possibility for fluid treatment buildup on lateral sides of the board area lying between adjacent wheels, and differences in amount of treatment that a board sees can occur, resulting in longitudinal bands of differential treatment. Also, as thinner boards (film) are transported by such thin wheels, the boards can bow in zones between wheels, thereby accumulating puddles of treatment liquid on the boards in the troughs formed on the boards between wheels. The build-up of solution on the boards is a compounding effect, since as more solution accumulates on the board, the board, absent support, is increasingly made more susceptible to buckling. The buckling creates a greater reservoir for yet additional treatment fluid to be taken up, thereby weighing down the film or board.

Attempts have been made to provide fingers or whiskers extending from a wheel for additional support of articles. However, the fingers must be spread out from one another to permit treatment administration. This can permit treatment liquid to build up on a board. In addition, there is still a linear path of differential treatment made by the wheel to which the fingers are attached.

THE PRESENT INVENTION

The present invention is directed to providing a process and apparatus for treating thin circuit boards, such as thin films. The process of the present invention includes moving the boards through a processing apparatus and supporting the boards with a transport means, while accommodating the weight of treatment chemicals, such as, for example, etching or rinsing solutions which tend to accumulate on the boards. The present invention supports the boards by contacting the boards with a transport conveyor. The transport conveyor is provided with a plurality of spaced apart rotation members which support the boards and are rotatably driven to serially move the boards through the apparatus. Furthermore, the rotation members of the transport conveyor are specially configured to facilitate chemical treatment distribution to the boards.

In a preferred arrangement, articles being treated are delivered to or positioned on the apparatus for initial or further treatment. The articles are carried along a generally horizontal path on the transport conveyor. The treatment delivering mechanisms, such as, for example, spray nozzles, dryers, or the like, are provided in proximity to the transport conveyor. The arrangement can comprise a single transport conveyor or may optionally have an additional transport conveyor mounted above the articles to "sandwich" the articles therebetween. The transport conveyor may be driven by the arrangement of rods and gears disclosed in U.S. Pat. No. 4,015,706, the complete disclosure of which is herein incorporated by reference.

The present invention can be employed in connection or in conjunction with the apparatus disclosed in the following U.S. Pat. Nos.: 4,999,079, 4,046,248, 4,017,982, and 3,935,041, the complete disclosures of which are herein incorporated by reference.

SUMMARY OF THE INVENTION

The present invention is directed to providing a method and apparatus directed to the treatment of printed circuit boards and films, whereby a transport conveyor is provided with a plurality of novel rotation members having an extended rim configuration for contacting and moving the articles through the apparatus. The extended rim of the rotation member facilitates support of the articles being transported thereby, and facilitates general uniform treatment of the articles with an etching or other chemical treatment fluid being delivered to the articles. The rim configuration permits a non-linear path to be made by the rim in relation to an article's surface.

It is a primary object of the present invention to provide a unique treatment process for thin articles wherein supporting and moving the thin articles is achieved through specialized contacting of the articles with a transport conveyor.

It is a further object of the present invention to support and move articles through a treatment apparatus by contacting the articles with a transport conveyor which provides alternating contact between different locations along an article's surface within a zone or region of contact.

It is another object of the present invention to move articles along a path of travel for treatment with a chemical processing step by contacting the articles along a non-linear area of contact along an article's surface.

It is another object of the present invention to provide a transport conveyor which includes a plurality of rotation members which each moves an article along a path of travel and provides both substantially lateral and substantially longitudinal support of said article along the predetermined path of travel.

It is another object of the present invention to accomplish any of the above objects where the chemical treatment includes delivering a spray of treatment fluid to the materials as they are being moved through the apparatus.

An additional object of the present invention is to provide a transport conveyor having a plurality of rotation members which include a generally sinuously configured rim on which articles are supported and moved through an apparatus.

Other objects and advantages of the present invention will be readily apparent to those skilled in the art from a reading of the following brief description of the drawing figures, the detailed description of the preferred embodiments, and the appended claims.

DETAILED DESCRIPTION OF THE PREFERRED EMBODIMENTS

Figure 1:
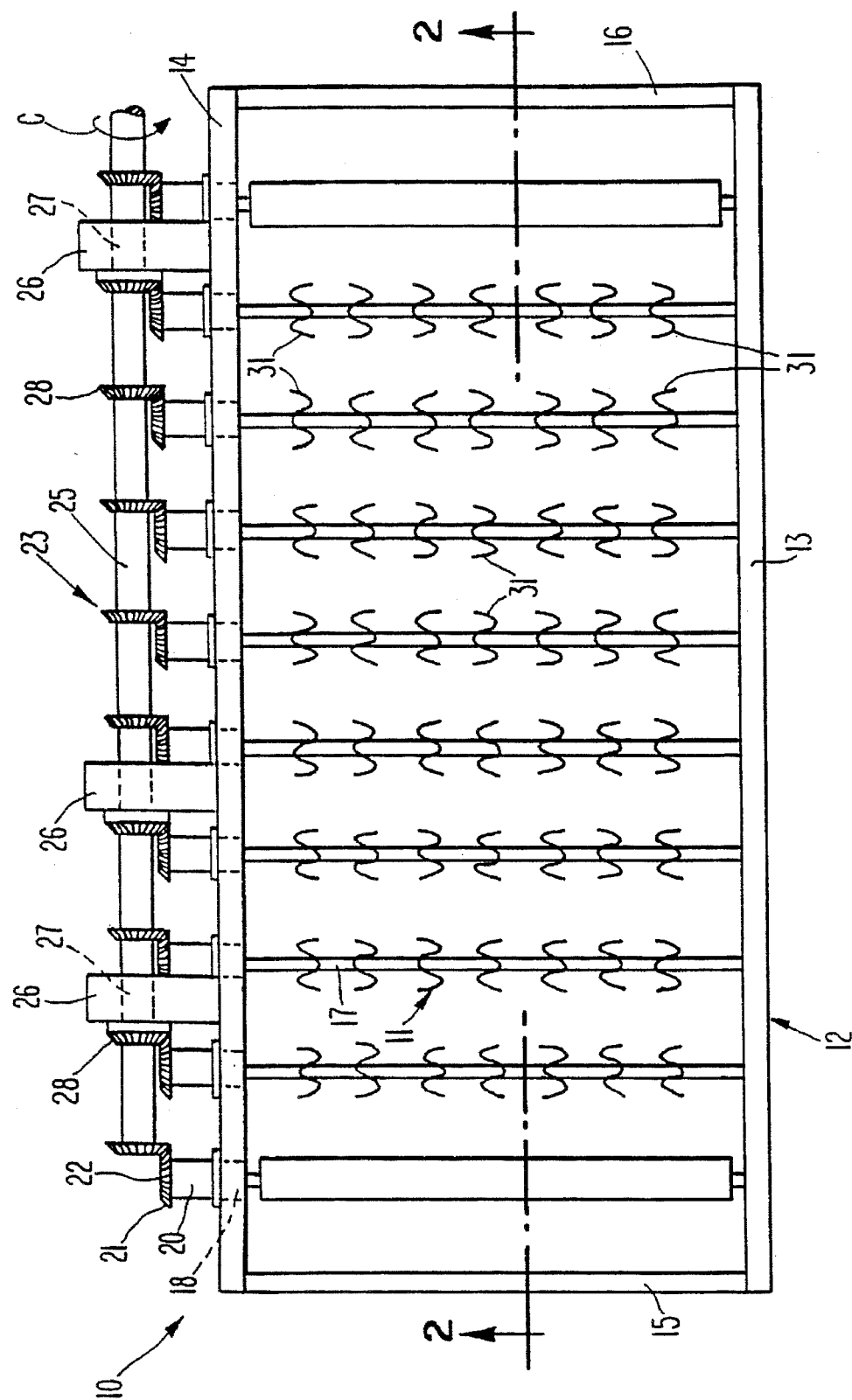
FIG. 1 is a top view of an apparatus showing the transport means of the present invention, the section being taken in a horizontal plane of the apparatus in which the articles are to travel, and generally along the line 1—1 of FIG. 2.

Referring now to the drawings in detail, reference is first made to FIG. 1, which shows an apparatus, generally designated by the numeral 10, comprising transport means 11. The apparatus 10, for example, can be part of a larger apparatus assembly (not shown) comprising one or more of a series of additional treatment, conveying or processing stations. A frame 12 which supports the transport means 11, is shown having a pair of oppositely disposed longitudinal wall portions 13, 14 connected by opposing transverse wall portions 15, 16.

The transport means 11 is shown, for example, comprising a series of rotatably mounted transverse rods 17 which extend between longitudinal frame wall portions 13 and 14. While not shown, it is understood that any suitable mounting means which permits rotation of the rods 17 can be employed to maintain one end of each rod 17 in position on frame wall portion 13. In the embodiment shown, each rod 17 is shown supported, at its opposite end, with a bearing member 18 which is disposed within frame wall portion 14. The rods 17 extend throughout the frame wall 14 and are each ultimately connected to a bevel gear 20. The bevel gear 20 is fixedly mounted on the rod 17, and has a chamfered peripheral portion 21 with teeth 22. The rods 17 are rotated in unison with any suitable drive means, such as that 23, to permit transport of articles through the apparatus 10. The drive means 23, for example, may comprise a drive shaft 25, such as that shown supported along the frame wall 14 with mounting blocks 26, which may each contain a bushing 27 through which the shaft 25 extends. Bevel gears 28 are provided along the shaft 25 at spaced apart intervals and at right angles to the gears 20 carried on the rods 17. The shaft gears 28 are in meshed engagement with rod gears 20 and provide rotation of the rods when the shaft 25 is rotated (generally in the direction of arrow "c", FIG. 1) by any suitable drive means, such as, for example, a motor (not shown). Alternately, any other drive may be provided for the rods 17.

The transport means 11 comprises a plurality of rotation members 31 which are carried on the transport rods 17 and rotate along with the rods 17. The rotation members 31 are preferably provided in spaced apart relation from one another along the length of the rods 17, and are fixedly secured to the rods 17 with any suitable attachment means, not shown. The rotation members 31 of one rod 17 are provided either in line with one another from rod to rod as shown or they may be in staggered relation to the rotation members 31 of an adjacent rod 17 (not shown).

Figure 2:
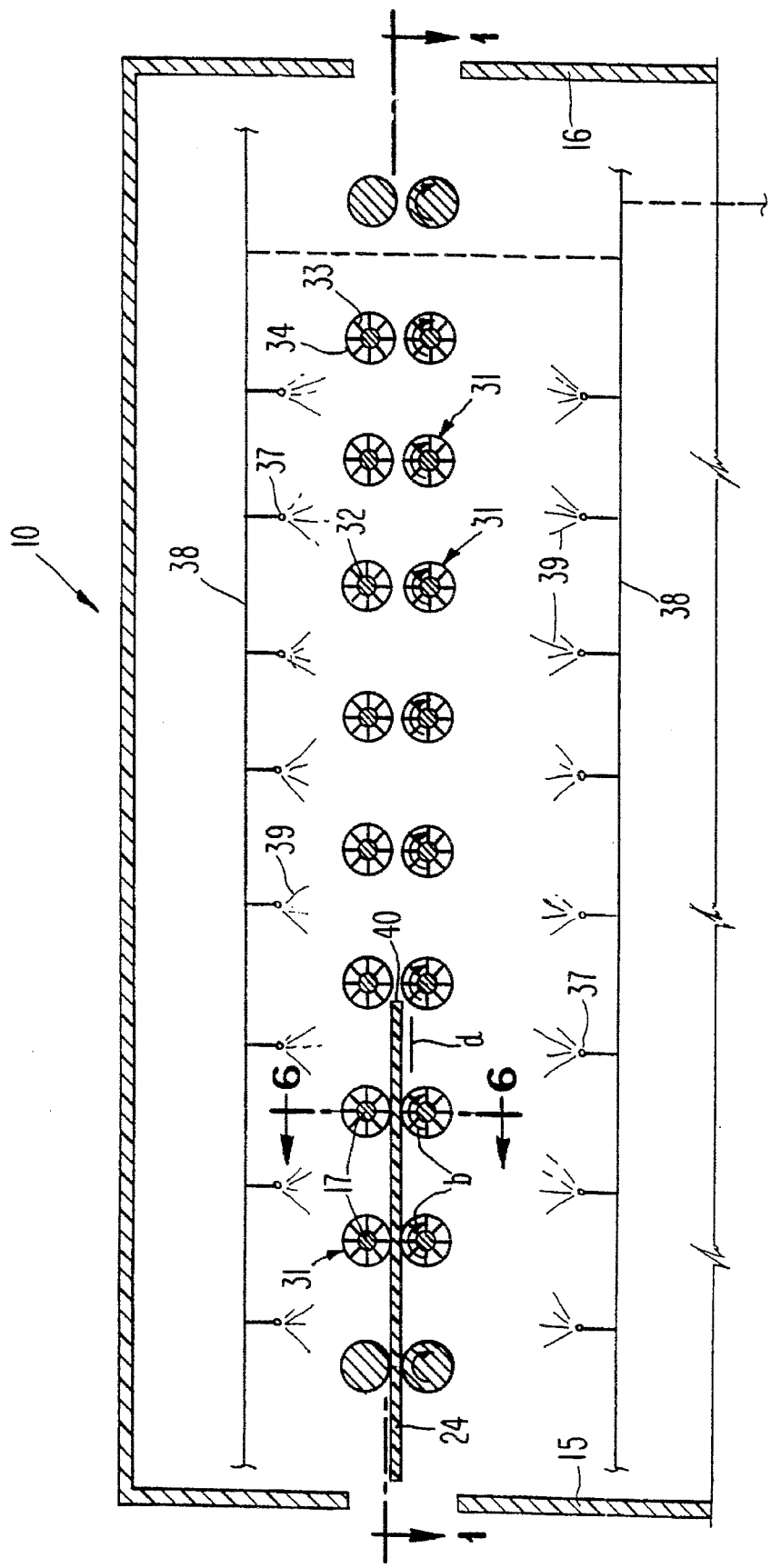
FIG. 2 is a longitudinal sectional view, partially schematic, taken generally along the line 2—2 of FIG. 1, showing an article being transported thereby.

Referring to FIG. 2, the rotation members 31 are driven to rotate in the direction of arrow "b" and contact the surface of an article, such as, for example, the circuit board 24. The driving of the rotation members 31 moves the board 24 along the path of travel through the apparatus 10. The board 24 thereby undergoes a chemical treatment step as it is moved through the apparatus 10.

Figure 6:
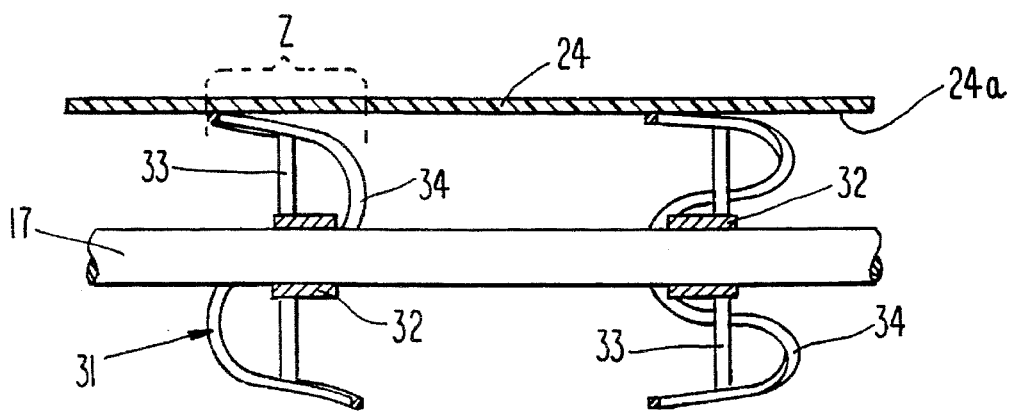
FIG. 6 is a partial sectional view taken along the line 6—6 of FIG. 2 showing an article supported on lower rotation members.

The rotation members 31 are shown in detail in FIGS. 3–6. A rotation member 31 is shown having a mounting means, such as the hub 32, which, as seen in FIG. 6, facilitates attachment of the rotation member 31 to a rod 17. Extending from the hub 32 is a plurality of rim support members 33. The support members 33 are shown extending radially outwardly from the hub 32 in a direction perpendicular to the hub axis. It will be understood that, while not shown, the support members 33 may be provided to extend outwardly from the hub 32 in other directions, such as, for example, in angular directions relative to said hub axis, or in any combination of directions, where some support members are perpendicularly extended and others are angularly extended.

The rotation member 31 is further provided with an article contacting portion, such as the rim 34. The support members 33 are spaced apart from one another to support the rim 34. As seen in FIGS. 2 and 6, the rim 34 which is connected to the support members 33, contacts an article 24 and moves the article 24 through the apparatus 10, as the rods 17 carrying the rotation members 31 are rotatably driven. The rim 34 is provided to support an article 24, as the article 24, which may become weighted down with accumulated treatment fluid, is being processed. The rim 34 of the rotation member 31, while continuing to support an article 24, moves the article 24 through the apparatus 10.

Figure 3:
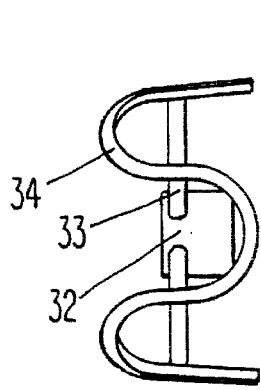
FIG. 3 is a side view of the rotation member of the transport conveyor.
Figure 4:
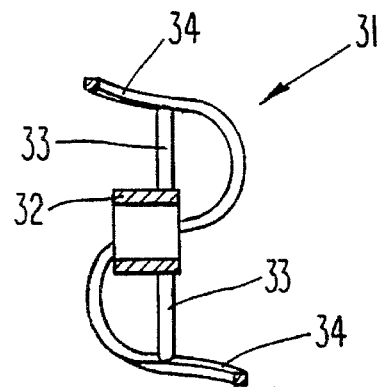
FIG. 4 is a sectional view of the rotation member, taken along the line 4—4 of FIG. 5.
Figure 5:
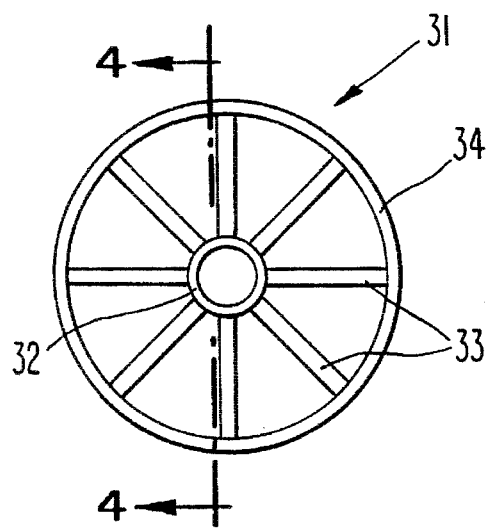
FIG. 5 is a front elevation view of the rotation member shown in FIG. 3.
Figure 7:
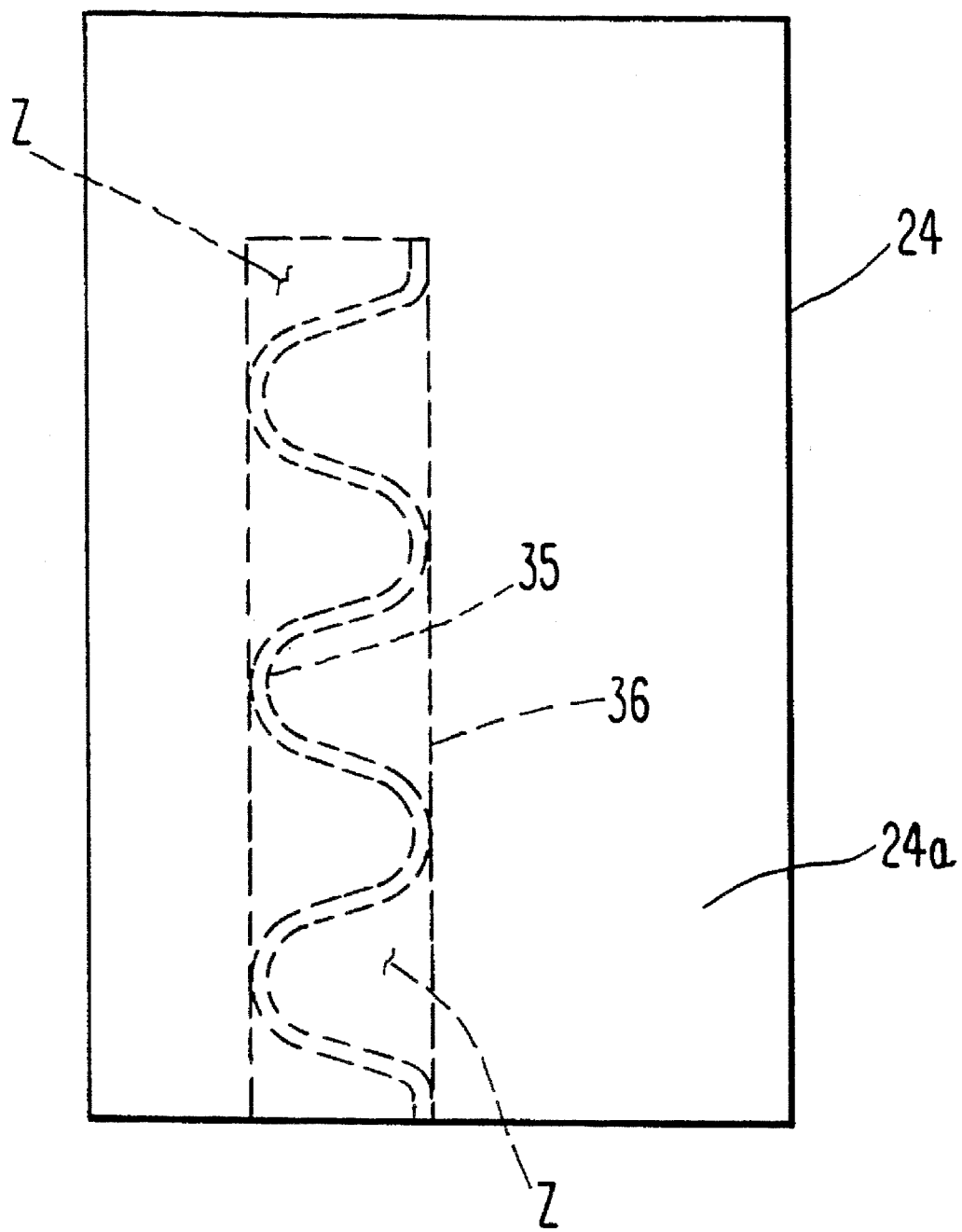
FIG. 7 is a bottom view of the surface of an article showing a contacting path of a rotation member of the present invention, with the contacting path being represented by the longitudinal zone shown by the dotted-lined rectangular area.

Referring to FIGS. 3 and 4, the rim 34 is shown having a sinuous configuration. The rim extends laterally on opposite sides of the support members 33 and supports an article 24 across a zone "z" of the article (FIGS. 6 and 7). While the article 24 is continuously supported on the rim 34 of a rotation member 31 as it is moved along a path of travel through the treatment apparatus 10 by the rotation member 31, the article 24 is not completely contacted along an entire zone of contact "z", but rather only at locations within the zone "z". The rim 34 therefore may make continuous contact with the article 24, but preferably, as shown in FIG. 7, travels through a non-linear path of contact 36 across a board surface 24a. The support of an article 24 traveling on the transport conveyor 11 is thereby increased without compromising the availability of the article's surface 24a to a treatment being delivered thereto. This enables increased lateral support of an article 24 to counteract heavy forces exerted on the article 24 from liquid treatment buildup, while, at the same time, providing accessibility of treatment delivery to an article surface 24a. The overall length of the rim 34 is preferably provided to be considerably larger in length than the theoretical length of a circumference measured about the support members 33 shown in FIG. 5. This increases the surface area of the transport means 11 which supports an article 24, and at the same time increases the zone of contact "z" over which support of an article 24 is maintained through contact of an article surface 24a at points and areas within the zone "z".

Referring to FIG. 7, a bottom view of the surface 24a of an article 24, such as, for example, a circuit board or film, is shown with a dotted-line representation of a preferred contacting path 35 of the rim 34 relative to the surface 24a of an article 24. The longitudinal zone "z" defined by the dotted-lined rectangular area 36 represents a theoretical zone for contact which the rim 34 of a rotation member 31 may make with the board surface 24a. It is noted that by contacting the board 24 with the sinuously configured rim 34, the lateral support of the article 24 is enhanced, while providing exposure of the article surface 24a within the zone "z" for the administration of treatment.

The rim 34 configuration provides an extended zone of contact "z" over which treatment may be delivered to an article 24. The configuration of the support members 33 also facilitates treatment delivery while providing support against potential forces exerted on an the article 24 by treatment build-up.

While not shown, other rim configurations, in addition to the sinuous rim 34 shown herein, may also be utilized. Such configurations for example, may include other generally wavy configurations, generally z-shaped or w-shaped configurations or combinations thereof, sinusoidal configurations and a configuration comprised of a series of arcuate portions. A suitable rim will have a configuration which can define on a article 24 being conveyed, an aggregate contact path in each revolution of the rotation member 31, which contact path is greater than the circumference of the rotation member 31.

The treatment delivery step is preferably achieved by administering a chemical treatment, such as an etchant, water rinse, developer, or other chemical to the articles 24 (FIG. 2). A product article 24, such as for example, a circuit board, film, or other material to be treated, is shown being received at the upstream end of the apparatus 10 by the transport means 11. Fluid treatment, for example, may be administered to an article 24 as it is moved along the transport means 11. Shown in FIG. 2, are a plurality of spray nozzles 37 connected to a common pipe or supply line 38. The nozzles 37, for example, may deliver a chemical etchant solution 39 to an article 24 passing through the apparatus 10.

The article 24 in FIG. 2 is shown being transported through the apparatus 10 while being supported with the rotation members 31 of the transport means 11. The leading edge 40 of the article 24 is caused to be received by the next rotation member 31 which the article 24 encounters. The placement and number of rotation members 31 along the transport rods 17 of the transport conveyor 11 can be arranged in accordance with the thickness, width and length of articles 24 which are to be processed.

While the above description and figures reference and disclose an upper series and lower series of transport rods 17 and rotation members 31, it shall be understood that depending upon the nature of the articles being processed, either the upper or lower series by itself may be appropriate for moving the articles through the apparatus 10. Also, while nozzles 37 are shown both above and below the article 24 traveling through the apparatus 10, it will be understood that a single set of nozzles (for example upper or lower) may be employed as well, consistent with the invention disclosed and described herein.

The orientation of articles and transport mechanisms, including the rotation members, while described in relation to a horizontal plane of travel, may be employed with equal success, consistent with the features and benefits herein described, in a variety of alternate operations, including vertically positioned rotation members. In addition, while the rotation members are shown transporting articles in a fluid treatment operation, it will be understood that the rotation members can be employed in other processing steps necessary for preparing printed circuit boards, including drying.

It will be further understood that various changes may be made in the details of construction, as well as in the use and operation thereof, all within the scope and spirit of the invention as recited in the appended claims.

What is claimed is:

1. An apparatus for use in transporting articles which are to be treated in an etching, rinsing or other chemical treatment operation, said apparatus comprising:

a) a treatment zone;

b) transport means in the treatment zone for defining a generally longitudinal path of travel through said apparatus;

c) treatment delivery means in the treatment zone for delivering a treatment of a chemical processing step to said articles;

d) wherein said transport means includes conveying means, said conveying means comprising a plurality of rotatable rods, each having a plurality of spaced apart rotation members;

e) said rotation members each having a hub mounted on and in driven relation to a rod, a peripheral rim, and support means between the hub and the rim for supporting the rim, and f) with the rim of each rotation member being configured to define on an article being conveyed, an aggregate contact path in each revolution of the rotation member, which contact path is greater than the circumference of the rotation member; and g) wherein said support means comprises a plurality of spokes which are connected to said hub at one end thereof and are provided in spaced-apart relation to each other about the circumference of said hub to permit passage of chemical treatment between the spokes; and h) wherein said spokes at their ends opposite the ends connected to said hub connect with said rim at spaced-apart intervals over the length of said rim to support said rim.

2. The apparatus of claim 1, wherein said rotation member rim comprises a plurality of arcuate portions for contacting said articles at different locations on the surface of an article.

3. The apparatus of claim 1, wherein each said rotation member rim has a wavy configuration of an overall length which is greater than the circumference of the rim.

4. The apparatus of claim 3, wherein said rotation member rim is provided having a continuous sinuous configuration.

5. An apparatus for use in transporting articles which are to be treated in an etching, rinsing or other chemical treatment operation associated with the preparation of printed circuit boards, said apparatus comprising:

a) a treatment zone;

b) transport means in the treatment zone for defining a generally longitudinal path of travel through said apparatus;

c) treatment delivery means in the treatment zone for delivering a treatment of a chemical processing step to said articles;

d) wherein said transport means includes conveying means, said conveying means comprising a plurality of rotatable rods, each having a plurality of spaced apart rotation members;

e) said rotation members each having a hub mounted on and in driven relation to a rod, a peripheral rim, and support means between the hub and the rim for supporting the rim;

f) with the rim of each rotation member being configured to define on an article being conveyed, an aggregate contact path in each revolution of the rotation member, which contact path is greater that the circumference of the rotation member;

g) wherein said rotation member rim is provided having a continuous sinuous configuration; and h) wherein said support means comprise a plurality of spokes connecting said hub with said rim.

* * * * *